United States Patent
Kim

(10) Patent No.: US 9,671,430 B2
(45) Date of Patent: Jun. 6, 2017

(54) TESTER AND TEST APPARATUS FOR TESTING SEMICONDUCTOR DEVICES HAVING THE SAME

(71) Applicant: SAMSUNG ELECTRONICS CO., LTD., Suwon-si, Gyeonggi-Do (KR)

(72) Inventor: Young-Hyun Kim, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 275 days.

(21) Appl. No.: 14/450,871

(22) Filed: Aug. 4, 2014

(65) Prior Publication Data
US 2015/0168483 A1    Jun. 18, 2015

(30) Foreign Application Priority Data

Dec. 17, 2013 (KR) .................. 10-2013-0157356

(51) Int. Cl.
G01R 31/20 (2006.01)
G01R 1/073 (2006.01)
G01R 31/28 (2006.01)
G01R 1/04 (2006.01)

(52) U.S. Cl.
CPC ....... G01R 1/07342 (2013.01); G01R 1/0408 (2013.01); G01R 31/2886 (2013.01)

(58) Field of Classification Search
CPC  G01R 1/0408; G01R 1/07342; G01R 1/0735; G01R 1/2886; G01R 31/2851; G01R 31/2886; G01R 31/2889; G01R 31/2891; G01R 31/2887
USPC ............. 324/754.08, 754.1, 574.11, 755.04, 324/755.05, 756.03, 756.07
See application file for complete search history.

(56) References Cited

U.S. PATENT DOCUMENTS

| 6,197,603 | B1 * | 3/2001 | Kohno ............... G01R 3/00 438/113 |
| 8,013,624 | B2 | 9/2011 | Namiki et al. |
| 8,248,089 | B2 | 8/2012 | Yang et al. |
| 2005/0184745 | A1 * | 8/2005 | Machida ......... G01R 1/0735 324/755.04 |
| 2009/0066349 | A1 | 3/2009 | Hsu et al. |
| 2010/0225345 | A1 | 9/2010 | Kim et al. |
| 2011/0031992 | A1 | 2/2011 | Kim et al. |
| 2011/0234251 | A1 | 9/2011 | Komatsu et al. |

(Continued)

FOREIGN PATENT DOCUMENTS

| JP | 4873083 | 12/2011 |
| JP | 2012-109300 | 6/2012 |

OTHER PUBLICATIONS

English Abstract for Publication No. 2011-141227 (JP4873083).

*Primary Examiner* — Arleen M Vazquez
*Assistant Examiner* — Steven Yeninas
(74) *Attorney, Agent, or Firm* — F. Chau & Associates, LLC

(57) ABSTRACT

A tester includes a level controller for independently restricting the central deformation and the peripheral deformation of a probe card. The level controller includes a single upper plate, a single first lower plate and a plurality of second lower plates. A first elastic force is applied to a central portion of the probe card by the first lower plate to restrict the central deformation. Second elastic forces are independently applied to peripheral portions of the probe card by the individual second lower plates to locally restrict the peripheral deformations.

16 Claims, 12 Drawing Sheets

(56) References Cited

U.S. PATENT DOCUMENTS

2011/0241716 A1 10/2011 Doi
2013/0027071 A1 1/2013 Canegallo et al.

* cited by examiner

TESTER AND TEST APPARATUS FOR TESTING SEMICONDUCTOR DEVICES HAVING THE SAME

CROSS-REFERENCE TO RELATED APPLICATIONS

This application claims priority under 35 U.S.C. §119 from Korean Patent Application No. 10-2013-0157356, filed on Dec. 17, 2013 in the Korean Intellectual Property Office, and all the benefits accruing therefrom, the contents of which are herein incorporated by reference in their entirety.

BACKGROUND

1. Technical Field

Exemplary embodiments are directed to a tester and a test apparatus for testing semiconductor devices, and more particularly, to a tester for testing electrical characteristics of semiconductor devices and a test apparatus having the same.

2. Discussion of the Related Art

In general, semiconductor devices are manufactured through sequential steps of a FAB (fabrication) process, an EDS (electric die sorting) process and an assembly process. A plurality of semiconductor devices are fabricated on a semiconductor wafer through various unit processes and the electrical characteristics of the semiconductor devices on the wafer are measured or tested in the EDS process. Defective devices and non-defective devices are sorted out in the EDS process. Finally, the non-defective devices are cut from the wafer into separate devices and each of the separate devices is packaged into a semiconductor package in the assembly process, so that the semiconductor packages are protected from external disturbances such as mechanical impacts and physical and chemical shocks.

In particular, some of the non-defective devices are repaired and other non-defective devices are removed from the wafer in the EDS process, so that the time and cost of the package test are reduced in the assembly process.

SUMMARY

An exemplary embodiment of the present inventive concept can provide a tester for testing electrical characteristics of semiconductor devices with improved reliability.

Another exemplary embodiment of the present inventive concept can provide a test apparatus for testing the semiconductor devices having the above tester.

According to some exemplary embodiments, there is provided a tester for testing electrical characteristics of semiconductor devices. The tester may include a main body for generating test signals that test the electrical characteristics of a semiconductor device and analyze device signals generated by the semiconductor device in response to the test signals, a head connected to the main body for processing the test signals and the device signals, a base connected to the head and to which a probe card may be secured, the probe card selectively making contact with the semiconductor devices, and a level controller inside of the base that independently restricts a peripheral deformation of the probe card and a central deformation of the probe card, to control a level of the probe card.

In an exemplary embodiment, the level controller may include an upper plate connected to the inside of the base and spaced above the probe card, a first lower plate under the upper plate in contact with a central portion of the probe card, a plurality of second lower plates under the upper plate in contact with a peripheral portion of the probe card so that the plurality of the second lower plates may be independently positioned and separated from the first lower plate, a first elastic member interposed between the upper plate and the first lower plate to apply a first restrictive force to the central portion of the probe card in proportion to a central deformation, to restrict the central deformation of the probe card, and a second elastic member interposed between the upper plate and the second lower plate to apply a second restrictive force to the peripheral portion of the probe card in proportion to a peripheral deformation, to restrict the peripheral deformation of the probe card.

In an exemplary embodiment, the base may include a hollow cylinder and the upper plate may include a single disk that has a plurality of stepped portions at an edge portion thereof, where the stepped portions of the upper plate may be circumferentially combined with the hollow cylindrical of the base.

In an exemplary embodiment, the first lower plate may include a single disk under a central portion of the upper plate and the plurality of second lower plates may include a plurality of split pieces under a peripheral portion of the upper plate that are spaced apart from and enclose the first lower plate.

In an exemplary embodiment, the split pieces may be independently positioned on the probe card, where each split piece may independently apply the second restrictive force to the peripheral portion of the probe card.

In an exemplary embodiment, the split pieces may include curved split pieces that are separated from an annulus that encloses the first lower plate.

In an exemplary embodiment, the plurality of the second lower plates may further include an additional plurality of curved split plates that may be positioned between the curved split pieces and the first lower plate.

In an exemplary embodiment, the first elastic member may include a plurality of elastic bodies that may be symmetrically positioned with respect to a central axis of the first lower plate and the plurality of second elastic members may include a plurality of elastic bodies, where an elastic body may be positioned at each end portion of each split piece.

In an exemplary embodiment, the elastic body may include one of a spring and an elastomer.

In an exemplary embodiment, the level controller may further include a first guide connected to a central portion of the first lower plate that penetrates the central portion of the upper plate to guide the first lower plate to move up and down, and a plurality of second guides connected to both end portions of each split piece that penetrate the peripheral portion of the upper plate to guide each of the split pieces to move up and down.

According to some exemplary embodiments, there is provided a test apparatus for testing semiconductor devices. The test apparatus may include a test chamber to hold a wafer that includes a plurality of semiconductor devices, a probe card disposed over the test chamber to make contact with the semiconductor devices being tested, and a tester connected to the probe card that transmits test signals for testing the semiconductor devices to the probe card and receives device signals generated by the semiconductor devices in response to the test signals, to test electrical characteristics of the semiconductor devices. The tester may include a main body to generate the test signals and analyze the device signals, a head connected to the main body to process the test signals and the device signals, a base connected to the head and to which the probe card may be secured, and a level controller inside of the base to independently restrict a peripheral deformation of the probe card and a central deformation of the probe card, to control a level of the probe card.

In an exemplary embodiment, the level controller may include an upper plate connected to the inside of the base and spaced above the probe card, a first lower plate under the upper plate in contact with a central portion of the probe card, a plurality of second lower plates under the upper plate in contact with a peripheral portion of the probe card so that the plurality of the second lower plates may be independently positioned and separated from the first lower plate, a first elastic member interposed between the upper plate and the first lower plate to apply a first restrictive force to the central portion of the probe card in proportion to the central deformation to restrict the central deformation of the probe card, and a second elastic member interposed between the upper plate and the second lower plate to apply a second restrictive force to the peripheral portion of the probe card in proportion to the peripheral deformation to restrict the peripheral deformation of the probe card.

In an exemplary embodiment, the level controller may further include a first guide connected to a central portion of the first lower plate that penetrates the central portion of the upper plate to guide the first lower plate to move up and down, and a plurality of second guides connected to both end portions of each second lower plate that penetrate the peripheral portion of the upper plate to guide each of the second lower plates to move up and down.

In an exemplary embodiment, the first lower plate includes a single disk under a central portion of the upper plate and the plurality of the second lower plates may include a plurality of split pieces under a peripheral portion of the upper plate that are spaced apart from and enclose the first lower plate.

In an exemplary embodiment, the test chamber may include a support to which the wafer may be secured and a position controller to move the support so that the semiconductor devices may make contact with the probe card.

According to some exemplary embodiments, there is provided a test apparatus for testing electrical characteristics of semiconductor devices. The test apparatus may include a probe card disposed in a test chamber to make contact with a plurality of semiconductor devices being tested, and a level controller inside of a base of a tester. The level controller may include an upper plate connected to the inside of the base and spaced above the probe card, a first lower plate under the upper plate that is in contact with a central portion of the probe card, a plurality of second lower plates under the upper plate that are in contact with a peripheral portion of the probe card, a first elastic member interposed between the upper plate and the first lower plate, the first elastic member to apply a first restrictive force to the central portion of the probe card in proportion to the central deformation to restrict a central deformation of the probe card, and a plurality of second elastic members interposed between the upper plate and the plurality of second lower plates to apply a second restrictive force to the peripheral portion of the probe card in proportion to a peripheral deformation to restrict the peripheral deformation of the probe card.

In an exemplary embodiment, the tester may include a main body to generate test signals and analyze device signals, and a head connected to the main body to transmit test signals for testing the semiconductor devices to the probe card and to receive device signals generated by the semiconductor devices in response to the test signals to test electrical characteristics of the semiconductor devices. The base may be connected to the head and may secure the probe card.

In an exemplary embodiment, the probe card may include a plurality of first combining members circumferentially positioned on a peripheral portion of an upper surface thereof to combine with second combining members positioned at a bottom of the base of the tester, and a plurality of probe tips positioned on a lower surface thereof to make contact with test pads of the semiconductor devices being tested.

In an exemplary embodiment, the first lower plate may include a single disk under a central portion of the upper plate and the plurality of second lower plates includes a plurality of split pieces under a peripheral portion of the upper plate that are spaced apart from and enclose the first lower plate. The split pieces may be independently positioned on the probe card and may include curved split plates that are separated from an annulus that encloses the first lower plate, and each split piece may independently apply the second restrictive force to the peripheral portion of the probe card. The first elastic member may include a plurality of elastic bodies that are symmetrically positioned with respect to a central axis of the first lower plate, and the plurality of second elastic members may includes a plurality of elastic bodies. An elastic body may be positioned at each end portion of each split piece.

In an exemplary embodiment, the level controller may further include a first guide connected to a central portion of the first lower plate that penetrates the central portion of the upper plate to guide the first lower plate to move up and down, and a plurality of second guides connected to both end portions of each split piece that penetrate the peripheral portion of the upper plate to guide each of the split pieces to move up and down.

According to exemplary embodiments of the present inventive concept, peripheral deformations and central deformations of the probe card may be sufficiently restricted while performing a test process in the test apparatus, such as an EDS process. The peripheral deformation and the central deformation may be individually controlled by the respective plates of the level controller, so that the level of the probe card may be accurately controlled. In particular, the second lower plates that contact the peripheral portion of the probe card may be composed of a plurality of split pieces, and each of the split pieces may be independently positioned with respect to each other. Therefore, although the peripheral deformations in the peripheral portion of the probe card may differ locally from point to point, each split piece may generate a restrictive force proportional to the local deformation of the peripheral portion. In addition, since the split pieces may be individually replaced or repaired, the maintenance cost of the second lower plates may be reduced.

Accordingly, the level of the probe card may be accurately controlled and thus the probe tips may make accurate contact with the test pads of the semiconductor devices, thereby improving the reliability of an electrical test process, such as an EDS process.

DETAILED DESCRIPTION OF THE EMBODIMENTS

Figure 1:
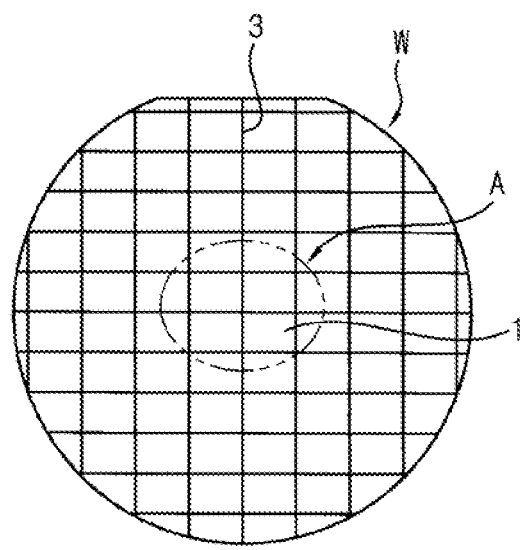
FIG. 1 illustrates a wafer that includes a plurality of semiconductor devices that need an electric die sorting (EDS) process.

Various exemplary embodiments will be described more fully hereinafter with reference to the accompanying drawings, in which some exemplary embodiments are shown. The present invention may, however, be embodied in many different forms and should not be construed as limited to the exemplary embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. Like numerals may refer to like elements throughout.

Hereinafter, exemplary embodiments will be explained in detail with reference to the accompanying drawings.

Figure 2:
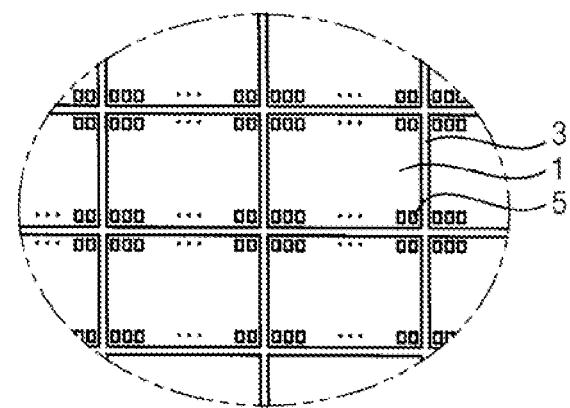
FIG. 2 is an enlarged view illustrating a portion 'A' of FIG. 1.

FIG. 1 illustrates a wafer including a plurality of semiconductor devices that need an electric die sorting (EDS) process. FIG. 2 is an enlarged view illustrating a portion 'A' of FIG. 1.

Referring to FIGS. 1 and 2, a plurality of the semiconductor devices 1 may be fabricated on the wafer W by a fabrication (FAB) process. The semiconductor devices 1 may be separated into individual devices by cutting the wafer along scribe lines 3. The individual devices may be packaged into a semiconductor chip by an assembly process.

The EDS process may be performed on the semiconductor devices 1 on the wafer W before the assembly process to test the electrical characteristics of the semiconductor devices. A plurality of test pads 5 may be arranged along a peripheral portion of the semiconductor device 1 on the wafer W. In an EDS process, electrical test signals may be applied to the test pads 5 and device signals responsive to the test signals may be detected and analyzed in the test equipment of the EDS. Then, the semiconductor devices 1 may be determined to pass or fail based on the test analysis. Thus, the test equipment for the EDS process may include various components for conducting the test and analysis.

Figure 3:
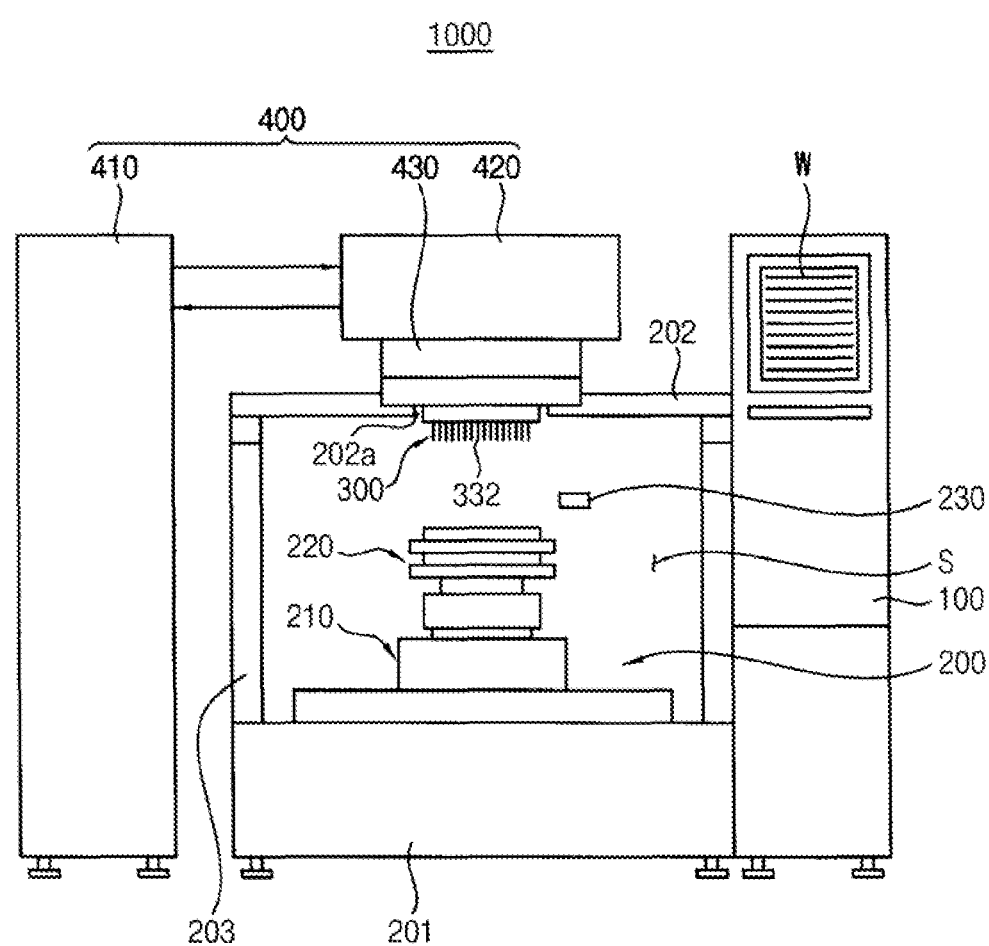
FIG. 3 is a structural view that illustrates a test apparatus for an EDS process in accordance with an exemplary embodiment of the present inventive concept.

FIG. 3 is a structural view that illustrates a test apparatus for an EDS process in accordance with an exemplary embodiment of the present inventive concept.

Referring to FIG. 3, a test apparatus 1000 for testing semiconductor devices in accordance with an exemplary embodiment of the present inventive concept may include a loader 100 that holds a plurality of wafers W on which a plurality of semiconductor devices may be arranged, a test chamber 200 in which the wafer loaded from the loader may be fixed to thereby prepare an EDS process, a probe card 300 arranged over the test chamber 200 that can make contact with the semiconductor devices on the wafer W while testing the electrical characteristics of the semiconductor devices, and a tester 400 that applies test signals to the probe card 300 and detects device signals responsive to the test signals from the semiconductor devices. The tester 400 may analyze the electrical characteristics of the semiconductor devices based on the devices signals.

The loader 100 may include a wafer transfer unit for transferring a plurality of the wafers W onto the loader, a load port on which the wafer transfer unit may be positioned and a wafer loader that can individually load a wafer into the test chamber 200.

When the fabrication process on the wafer W is completed and a plurality of the semiconductor devices have been fabricated on the wafer W, a plurality of the wafers W having the semiconductor devices may be stacked in a wafer transfer unit such as a front opening universal pod (FOUP). Then, the wafer transfer unit may be moved to the load port of the loader 100, and the wafer W may be individually loaded into the test chamber 200 from the wafer transfer unit by the wafer loader. When a test process on the wafer W, such as an EDS process, is completed, the wafer W may be returned into the wafer transfer unit from the test chamber 200 by the wafer loader and the wafer transfer unit may be removed from the load port of the loader 100. For example, the wafer loader may include a robot arm.

The test chamber 200 may be positioned adjacent to the loader 100 and the wafer W may be individually loaded into the test chamber 200 from the loader 100. For example, the test chamber 200 may include a bottom 201 having sufficient thickness and stiffness for protection from external vibrations and forces, a pair of side walls 203 that extend upwards from the bottom 201 and a cover 202 connected to upper portions of the side walls 203 to thereby cover the bottom 201 in such a configuration that the bottom 201, the cover 202 and the side walls 203 may enclose a receiving space S.

A position controller 210 and a support 220 may be disposed on the bottom 201 in the receiving space S. The wafer W may be loaded onto the support 220 from the loader 100 and be secured to the support 220. The position of the support 220 may be controlled by the position controller 210 so that the semiconductor devices on the wafer W can make contact with the probe card 300 positioned over the support 220.

The position controller 210 may be secured to the bottom 201 and may vertically move the support 220 up and down in a z-axis direction. In addition, the position controller 210 may horizontally move the support 220 in a plane defined by an x-axis and a y-axis. Further, the position controller 210 may rotate the support 220 with respect to each of the x-axis, the y-axis and the z-axis.

The support 220 may be secured to the position controller 210 and the wafer W may be secured onto a surface of the support 220 so that the test pads 5 of the semiconductor devices 1 may face the probe card 300 over the support 220.

Once the wafer W has been secured to the support 220, the support 220 may be rotated so that the test pad 5 and the probe card 300 face each other, and then may be horizontally displaced to align the test pad 5 with a probe tip 332 of the probe card 300. Thereafter, the support 220 may be displaced upwards so that the test pads 5 can make contact with the probe tips 332 of the probe card 300.

A contact checking unit 230 may be further provided in the receiving space S to check the contact between the probe tips 332 and the test pads 5. For example, a contact mark may be provided on a test pad 5. When the test pad 5 makes sufficient contact with the probe tip 332, the contact checking unit 230 may detect the contact mark on the test pad 5 to thereby check the contact between the test pad 5 and the probe tip 332.

For example, the contact checking unit 230 may include an imaging system such as a direct probe sensor (DPS) camera. The DPS camera may be located at a side portion of the support 220 and may take a picture of the test pad 5, to obtain imaging data of the test pad 5. The image data of the test pad 5 may be analyzed to determine whether the contact between the test pad 5 and the probe tip 332 is good after the contact mark has been identified.

The probe card 300 may penetrate through an opening 202a of the cover 202 of the test chamber 200 and may face the support 220. The tester 400 may be connected to the probe card 300. The test signals that test the electrical characteristics of the semiconductor devices 1 may be applied to the semiconductor devices 1 through the probe card 300 from the tester 400. The device signals, which may be generated from the semiconductor devices 1 in response to the test signals, may be transmitted to the tester 400 from the semiconductor devices 1 through the probe card 300.

Figure 4:
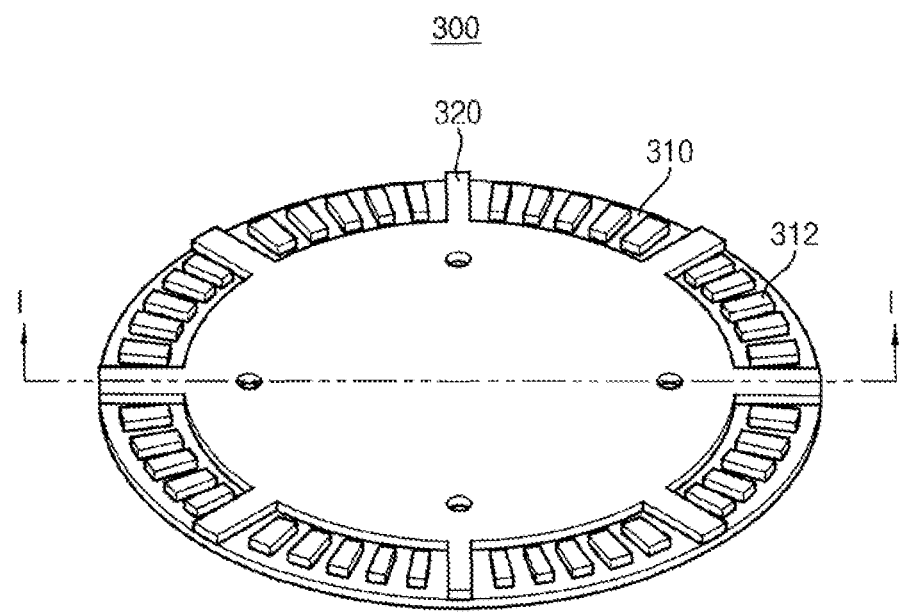
FIG. 4 is a perspective view that illustrates an upper surface of the probe card shown in FIG. 3.
Figure 5:
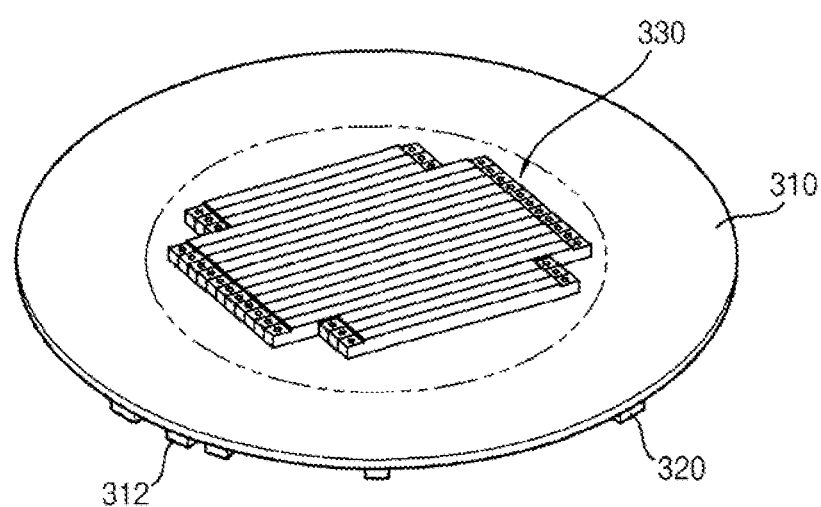
FIG. 5 is a perspective view that illustrates a lower surface of the probe card shown in FIG. 3.
Figure 6:
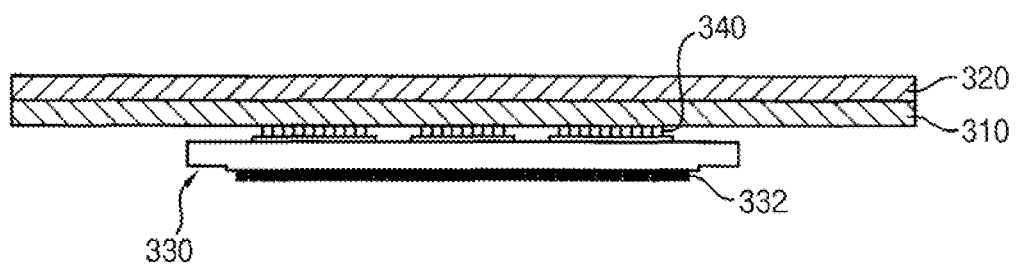
FIG. 6 is a cross-sectional view of the probe card cut along a line I-I' of FIG. 4.

FIG. 4 is a perspective view that illustrates an upper surface of the probe card shown in FIG. 3 and FIG. 5 is a perspective view that illustrates a lower surface of the probe card shown in FIG. 3. FIG. 6 is a cross-sectional view of the probe card cut along a line I-I' of FIG. 4.

Referring to FIGS. 4 to 6, the probe card 300 may include a disk-shaped circuit board 310, a stiffener 320 for stiffening the circuit board 310 to prevent deformation of the circuit board 310, and a probe block 330 that includes a plurality of probe tips 332 and that extends along a group of rows of the semiconductor devices or a group of columns of the semiconductor devices on the wafer W. The probe tips 332 may make contact with the test pads 5 of the semiconductor devices 1.

For example, the circuit board 310 may include a glass epoxy resin and circuit wirings may be provided in the circuit board 310. The tester 400 and the semiconductor devices 1 may be electrically connected to each other through the circuit wirings of the circuit board 310. A plurality of first combining members 312 may be circumferentially arranged on a peripheral portion of the upper surface of the circuit board 310. The first combining members 312 may be combined with second combining members (436 in FIG. 7) of the tester 400, so that the probe card 300 may be combined with the tester 400 by inter-connection of the first combining members 312 and second combining members 436.

The stiffener 320 may be disposed on the upper surface of the circuit board 310 and may prevent deformation such as bending and torsion of the circuit board 310.

The probe block 330 may be disposed on the lower surface of the circuit board 310, and may have a bar shape that extends along a device row or a device column of the semiconductor devices 1. A plurality of probe tips 332 may protrude from the probe block 330. In addition, the probe block 330 may be secured to the circuit board 310 by a conductive adhesive such as an interposer 340.

Figure 7:
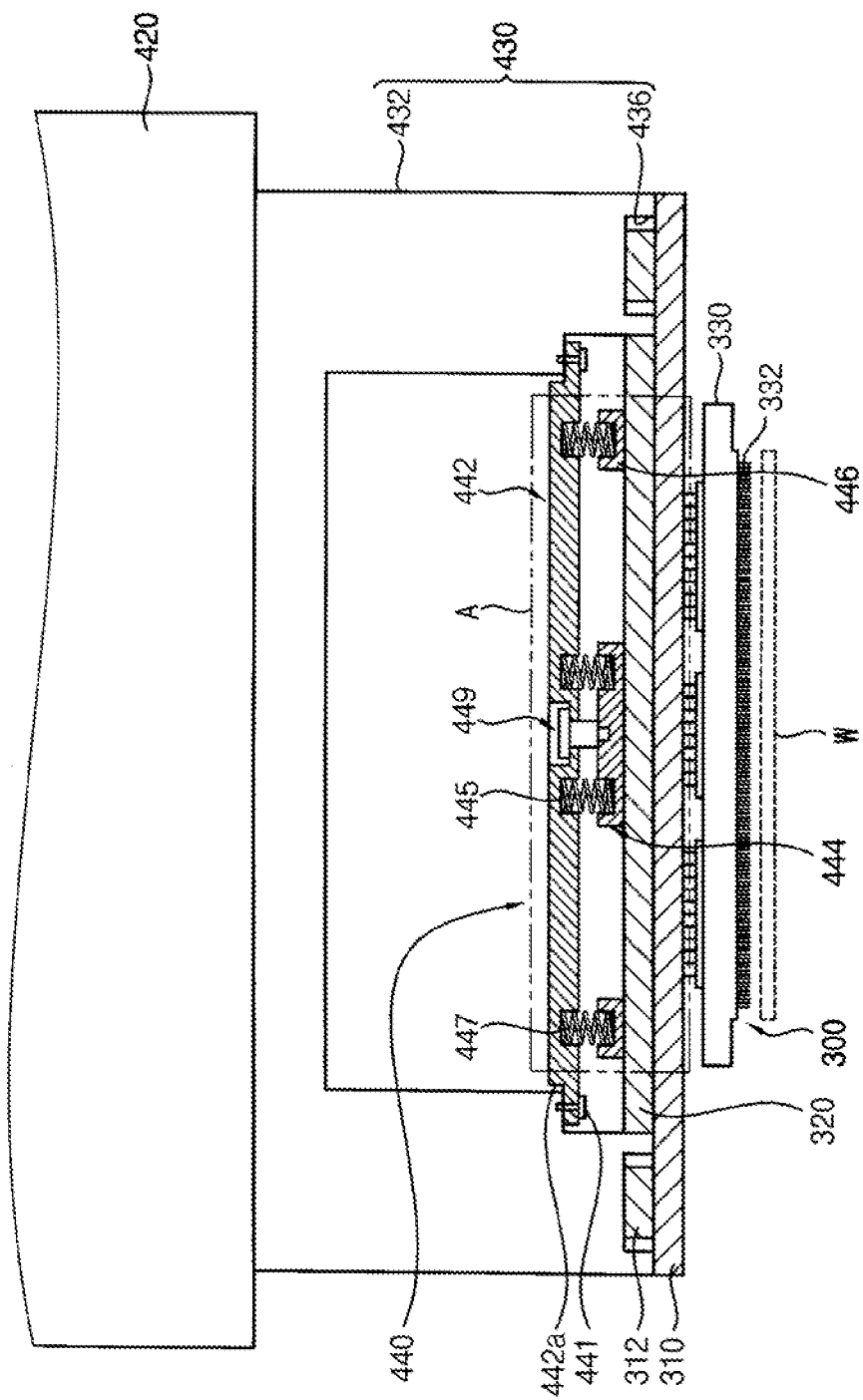
FIG. 7 is a cross-sectional view that illustrates the configuration of the level controller with respect to the probe card.

FIG. 7 is a cross-sectional view that illustrates the configuration of a level controller with respect to the probe card. Referring to FIGS. 3 and 7, the tester 400 may control the probe card 300 and may test the electrical characteristics of the semiconductor devices 1. The tester 400 may include a main body 410, a head 420, a base 430, and a level controller 440.

The main body 410 may be positioned at a side of the test chamber 200 and may generate the test signals for testing the electrical characteristics of the semiconductor devices 1 and may transmit the test signals to the probe card 300. In addition, the device signals generated from the semiconductor devices 1 in response to the test signals may be transmitted to the main body 410, and the main body 410 may evaluate each of the semiconductor devices to determine whether the semiconductor devices are defective or non-defective based on the analysis of the device signals.

The head 420 may be electrically connected to the main body 410 and may include electronic circuits for processing the test signals and the device signals. The base 430 may be may be positioned under the head 420, so that the probe card 300 and the head 420 may be connected with each other via the base 430. The test signals and the device signals may be exchanged between the main body 410 and the probe card 300 through the head 420.

The base 430 may be connected to a lower portion of the head 420 and the probe card 300 may be secured to the base 430. For example, the base 430 may be a hollow cylinder that includes a plurality of the second combining members 436 circumferentially disposed at an end portion of the cylindrical base 430. The hollow cylindrical base 430 may be positioned on the upper surface of the disk-shaped circuit board 310 so that the first combining members 312, which are also circumferentially disposed on the circuit board 310, may be combined with the second combining member 436. Therefore, the tester 400 may be combined with the probe card 300 by the first and the second combining members 312 and 436.

The level controller 440 may be disposed inside of the cylindrical base 430. The level controller 440 may control a level or a horizontal position of the probe card 300. When the circuit board 310 of the probe card 300 is combined with the base 430, the level controller 440 may make contact with the upper surface of the circuit board 310 and may control and restrain the deformation of the circuit board 310 by applying an external force to the circuit board 310.

In particular, the level controller 440 may independently control a peripheral deformation and a central deformation of the circuit board 310 so that the level of the probe card 300 may be accurately controlled. That is, peripheral deformation, which is a deformation of the peripheral portion of the probe card 300, and central deformation, which is a deformation of the central portion of the probe card 300, may be individually controlled and restrained irrespective of each other. Thus, the deformation of the probe card 300 may be accurately controlled over a whole surface of the circuit board 310 of the probe card 300. Therefore, the overall deformation of the probe card, such as thermal deformation and mechanical deformation, may be sufficiently restrained so that the level of the probe card 300 may be maintained at a high degree of accuracy.

A conventional EDS process may be repeatedly performed in the test apparatus 1000 at a temperature range of about −25° C. to about 95° C., so that thermal deformation may be repeatedly generated along a whole surface of the probe card 300. Furthermore, since the first and the second combining members 312 and 416 may be circumferentially disposed along the peripheral portions of the circuit board 310 and the cylindrical base 430, mechanical deformation may be increased at the central portion of the probe card 300 due to a bending moment when the probe tips 332 and the semiconductor devices 1 make contact with each other at the central portion of the probe card 300.

However, the level controller 440 may control and restrict the deformation of the probe card 300 at both the central portion and the peripheral portion individually, so that the level of the probe card 300 may be accurately controlled in spite of thermal deformations along the whole probe card 300 and the centrally-focused mechanical deformations.

Figure 8:
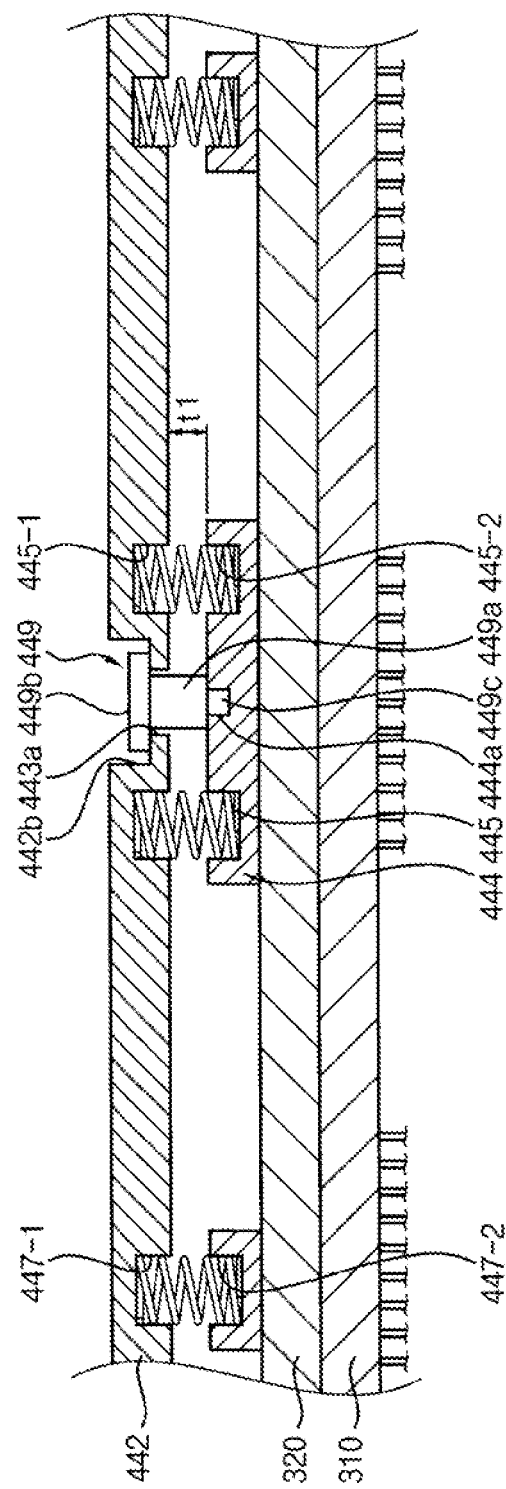
FIG. 8 is an enlarged view of a portion 'A' of FIG. 7.

FIG. 8 is an enlarged view of a portion 'A' of FIG. 7.

Referring to FIGS. 7 and 8, when the probe card 300 is combined with the base 430 so that the first combining members 312 of the circuit board 310 are inserted into the second combining members 436 of the base 430, the support 220 may be displaced upwards toward the probe card 300 by the position controller 210 until the test pads 5 of the semiconductor devices 1 on the wafer W, which may be secured onto the support 220, make contact with the probe tips 332 of the probe card 300 to initiate an EDS process.

Since the probe tips 332 of the probe block 330 may be disposed at a central portion of the circuit board 310 and the first combining members 312 may be circumferentially disposed along the peripheral portion of the circuit board 310, the contact force between the probe tips 332 and the wafer W may cause a bending moment in the circuit board 310. Thus, the circuit board 310 would be deformed into a concave shape if an additional external force for counterbalancing the bending stress caused by the bending moment, referred to as a restrictive force, were not applied to the circuit board 310.

Since the level controller 440 in the base 430 may make physical contact with the stiffener 320, a restrictive force may be applied by the level controller 440 to the circuit board 310 against the bending stress. Therefore, the bending stress may be counterbalanced by the restrictive force and the central deformation caused by the bending stress may be restricted at the central portion of the probe card 300, which may sufficiently maintain the level of the probe card 300 despite the bending moment.

Figure 9:
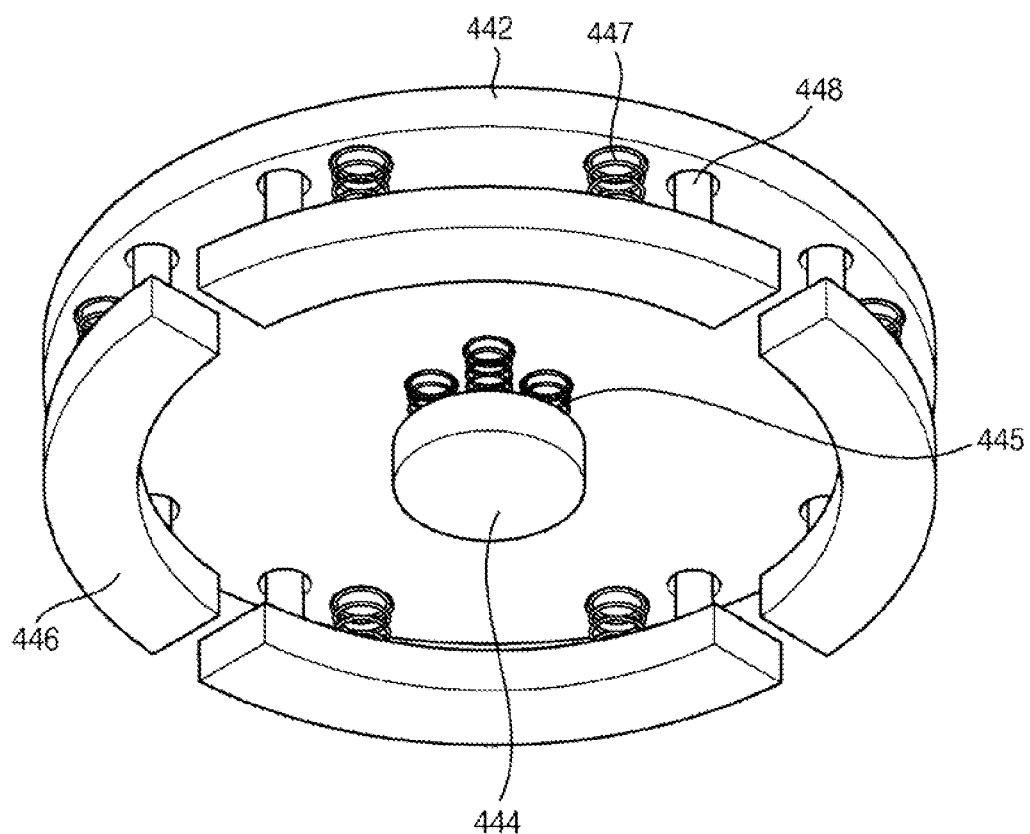
FIG. 9 is a perspective view that illustrates the level controller shown in FIG. 7.
Figure 10A:
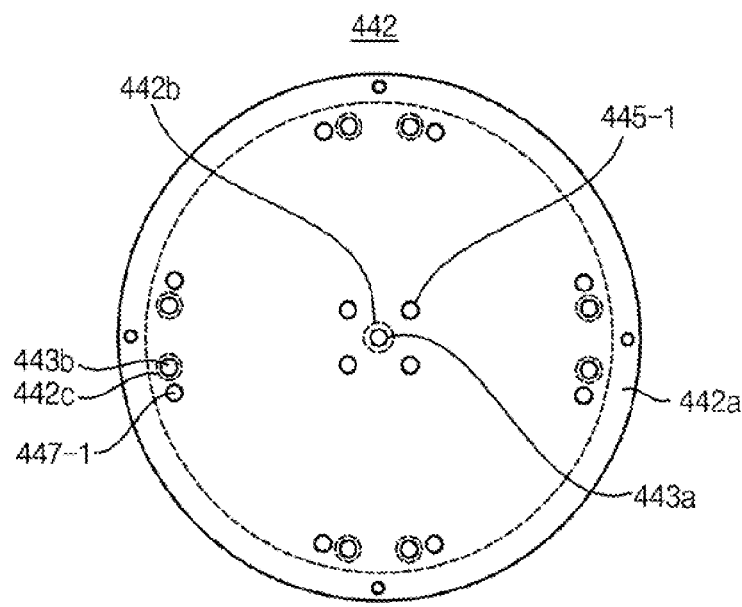
FIG. 10A is a rear view that illustrates an upper plate of the level controller shown in FIG. 9.
Figure 10B:
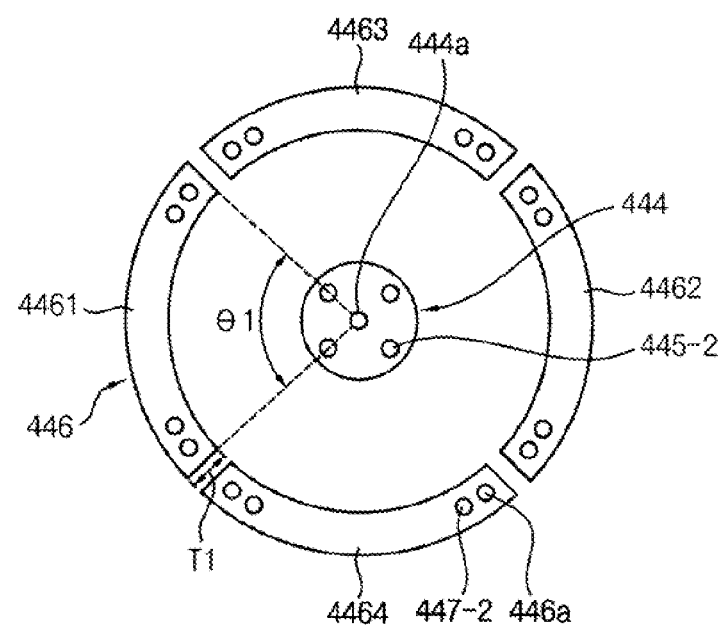
FIG. 10B is a front view that illustrates a lower plate of the level controller shown in FIG. 9.

FIG. 9 is a perspective view that illustrates the level controller shown in FIG. 7. FIG. 10A is a rear view that illustrates an upper plate of the level controller shown in FIG. 9 and FIG. 10B is a front view that illustrates a lower plate of the level controller shown in FIG. 9.

Referring to FIGS. 7, 8, 9, 10A and 10B, the level controller 440 may include an upper plate 442, a first lower plate 444 connected to a central portion of the upper plate 442 by at least a first elastic member 445, and a plurality of second lower plates 446 connected to a peripheral portion of the upper plate 442 by a plurality of second elastic members 447. The second lower plates 446 may be separated from each other and may be connected to the upper plate 442 by the second elastic members 447, respectively.

The upper plate 442 may have a single disk shape and may be secured to the inside of the base 430. For example, a stepped portion 442a may be disposed at an edge portion of the upper plate 442 and a joint member 441 may penetrate the stepped portion 442a and be inserted into a cylindrical body 432 of the base 430. Thus, the upper plate 442 may be combined to the base 430 by the joint member 441. A rear surface of the upper plate 442 may be spaced above the stiffener 320.

A central recess 442b may be disposed at a central portion of a front surface of the upper plate 442 and a central penetration hole 443a may be disposed at a bottom of the central recess 442b. A first guide 449 may be inserted into the first lower plate 444 through the central penetration hole 443a, so that the upper plate 442 and the first lower plate 444 may be secured to each other. A plurality of peripheral recesses 442c may be circumferentially disposed along the peripheral portion of the front surface of the upper plate 442 and a peripheral penetration hole 443b may be disposed at a bottom of each peripheral recess 442c. A second guide 448 may be inserted into the second lower plate 446 through the peripheral penetration hole 443b, so that the upper plate 442 and the second lower plate 446 may be secured to each other.

A plurality of first upper receiving portions 445-1 and a plurality of second upper receiving portions 447-1 may be disposed on the rear surface of the upper plate 442, and the first elastic members 445 may be received in the first receiving portion 445-1 and the second elastic members 447 may be received in the second receiving portion 447-1. For example, the first upper receiving portions 445-1 may be symmetrically positioned around the central recess 442b with respect to a central axis of the central penetration hole 443a. Pairs of the second upper receiving portions 447-1 may be positioned on the peripheral portion of the rear surface of the upper plate 442 while being spaced apart from each other.

The first and second lower plates 444 and 446 may be positioned on the stiffener 320 so that the first and second lower plates 444 and 446 may each face the upper plate 442. The first lower plate 444 may be connected to the upper plate 442 by the first elastic members 445 and the second lower plates 446 may be connected to the upper plate 442 by the second elastic members 447. Thus, the first lower plate 444 may make contact with the central portion of the probe card 300 and the second lower plates 446 may make contact with the peripheral portion of the probe card 300.

The first lower plate 444 may have a single disk shape and may be positioned under the central portion of the upper plate 442. A first securing portion 444a may be disposed on a center of a front surface of the first lower plate 444 and may be aligned with the central penetration hole 443a. Thus, the first guide 449 may be secured to the first securing portion 444a through the central penetration hole 443a. A plurality of first lower receiving portions 445-2 may be disposed on a periphery of the front surface of the first lower plate 444. The first lower receiving portions 445-2 may be aligned with the first upper receiving portions 445-1, respectively, so that the first lower receiving portions 445-2 may be symmetrically positioned with respect to a central axis of the first securing portion 444a.

In a present exemplary embodiment, the first upper receiving portions 445-1 may include four receiving indentations that may be symmetrically positioned with respect to the central penetration hole 443a and the first lower receiving portions 445-2 may also include four receiving indentations that may be symmetrically positioned with respect to the first securing portion 444a. A first end portion of the first elastic member 445 may be received into the first upper receiving portions 445-1 and a second end portion of the first elastic member 445 may be received into the first lower receiving portions 445-2. Accordingly, four elastic members 445 may be interposed between the upper plate 442 and the first lower plate 444 that are symmetrically positioned with respect to the central penetration hole 443a and the first securing portion 444a.

While a present exemplary embodiment discloses a single disk as the first lower plate 444, various other modifications and shapes may be allowed in the first lower plate 444 based on the function and structure of the level controller 440.

The second lower plates 446 may be split pieces individually arranged under the peripheral portion of the upper plate 442. For example, the second lower plate 446 may include four curved split plates 4461 to 4464 that may be separated from a single annulus. The single annulus may be positioned around the first lower plate 444 so that the first lower plate 444 may be enclosed within the single annulus. Then, the single annulus may be separated into a plurality of circular arcs having a same angular width θ1 with respect to a center of the first securing portion 444a, thereby forming the curved split plates 4461 to 4464 that may be circumferentially positioned under the peripheral portion of the upper plate 442.

In a present exemplary embodiment, the second lower plates 446 may include four curved split pieces having the same size and angular width θ1. However, the size and the angular width θ1 of the curved split pieces may differ from each other as long as a pair of split pieces that are opposite each other with respect to the central axis of the first lower plate 444 have the same angular width θ1 and size.

A second securing portion 446a may be disposed on a front surface of the second lower plate 446 and may be aligned with the peripheral penetration hole 443b. In addition, a second lower receiving portion 447-2 may be disposed on the front surface of the second lower plate 446 and may be aligned with the second upper receiving portion 447-1. For example, the second lower plate 446 may be shaped as a curved arc along the disk shaped upper plate 442, so that a pair of the second securing portions 446a may be positioned at both end portions of the curved arc of the second lower plate 446 and a pair of the second lower receiving portions 447-2 may be positioned at both end portions of the curved arc of the second lower plate 446.

In a present exemplary embodiment, the second lower plates 446 may include four curved split plates 4461 to 4464, thus eight of the second securing portions 446a and eight of the second lower receiving portions 447-2 may be positioned on the second lower plates 446. A first end portion of the second elastic member 447 may be received in the second upper receiving portion 447-1 and a second end portion of the second elastic member 447 may be received in the second lower receiving portion 447-2. Since a pair of the second elastic members 447 may be positioned on each curved split plates 4461 to 4464, with one second elastic member 447 at each end thereof, eight of the second elastic members 447 may be interposed between the second lower plates 446 and the peripheral portion of the upper plate 442.

The second guides 448 may be secured to the second securing portions 446a through the peripheral penetration hole 443b at each end portion of each of the curved split plates 4461 to 4464. Thus, each of the curved split plates 4461 to 4464 may be connected to the peripheral portion of the upper plate 442 by a pair of the second guides 448.

The deformations of the curved split plates 4461 to 4464 may be individual and independent from one another. Thus, if the external forces on the peripheral portion of the probe card 300 differ locally from point to point, deformation of the probe card 300 may be non-uniform along the peripheral portion. The restrictive force may be respectively applied to the peripheral portion of the probe card 300 in proportion to the deformation of the curved split plates 4461 to 4464, to thereby accurately control the level of the probe card 300.

Since the peripheral portion of the probe card 300 may be secured to the base 430 and the central portion of the probe card 300 may make contact with the wafer W, a maximal bending stress may be applied to the central portion and the peripheral portion of the probe card 300. Thus, a central restrictive force may be applied to the central portion of the probe card 300 by the first lower plate 444 and a peripheral restrictive force may be applied to the peripheral portion of the probe card 300 by the second lower plates 446, so that the central deformation and the peripheral deformation of the probe card 300 may be sufficiently restricted by the level controller 440. Accordingly, the level of the probe card 300 may be accurately controlled by the respective deformation controls for both of the central and the peripheral portions thereof.

In particular, the external forces acting on the probe card 300 may vary based on the configurations of the probe card 300, the structures of the test apparatus 1000, such as the configurations and operation method of the position controller 210 and the contact conditions between the probe card 300 and the wafer W, so that the deformations of the probe card 300 may vary from point to point in proportion to the local external force. However, since the second lower plates 446 of the level controller 400 may be positioned on the probe card 300 separately from each other and since the deformations of the second lower plates 446 may be individual and independent from each other, the restrictive forces applied to the probe card 300 by the level controller 400 for restricting the deformation of the probe card may be varied in proportion to the local deformations of probe card 300.

The number, the size and the location of the second lower plates 446 may be varied based on the distribution of deformations on the peripheral portion of the probe card 300. In addition, the number and locations of the second elastic members 447 may also be varied based on the distribution of deformations on the peripheral portion of the probe card 300.

For example, a variation of the angular width θ1 and an annular width T1 of the curved split plates 4461 to 4464 may change the contact area between the stiffener 320 and each split piece and change the number of the second lower plates 446. In addition, the second lower plates 446 may have other shapes in addition to the curved arc shape illustrated in the figures.

FIGS. 11A to 11D illustrate modifications of the second lower plates shown in FIG. 10B.

Figure 11A:
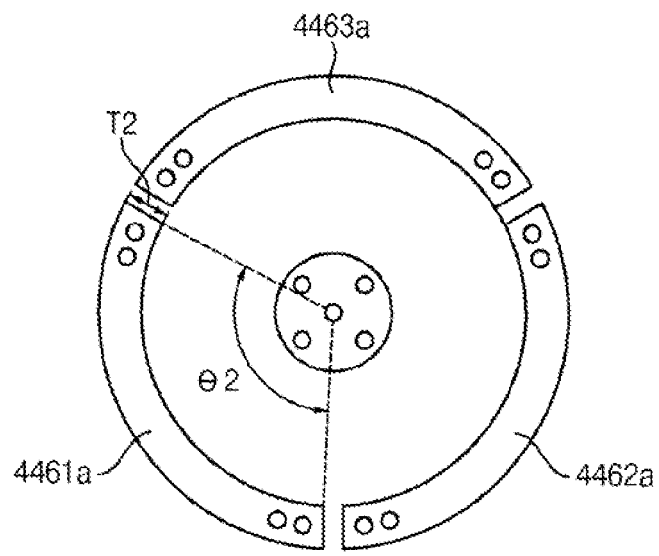
FIGS. 11A to 11D illustrate modifications of the second lower plates shown in FIG. 10B.

As shown in FIG. 11A, the second lower plates 446 may be modified into three curved split plates 4461a to 4463a having an increased angular width θ2 and an increased annular width T2, so that the contact area between the stiffener 320 and each of the curved split plates 4461 to 4463a may be increased. Thus, enlarged curved split plates 4461a to 4463a may be used as the second lower plates 446.

Figure 11B:
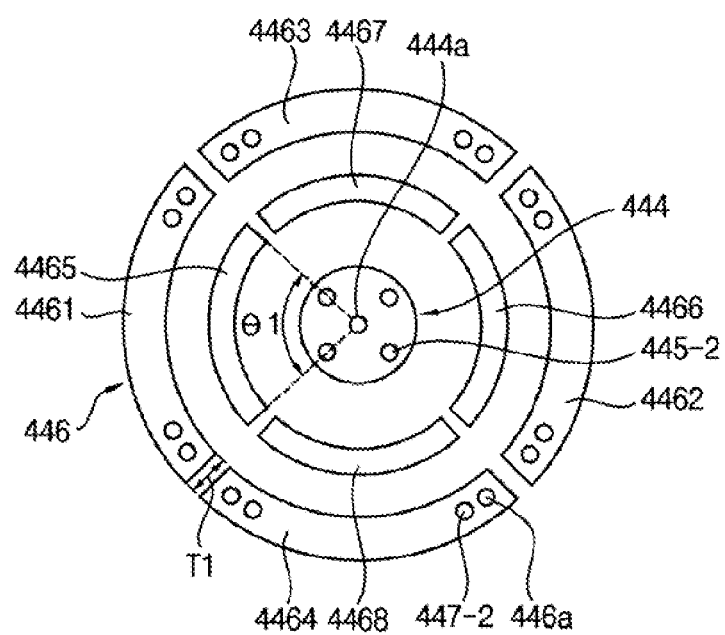

Referring to FIG. 11B, additional curved split plates 4465 to 4468 may be positioned between the first lower plate 444 and the curved split plates 4461 to 4464 without changing the angular width θ1 and the annular width T1. For example, an additional annulus with a radius that is less than that of the annulus that forms the curved split plates 4461 to 4464 may be disposed around the first lower plate 444 so that the first lower plate 444 may be enclosed by the additional annulus. Then, the additional annulus may be separated into a plurality of circular arcs having the same angular widths θ1 with respect to a center of the first securing portion 444a as the curved split plates 4461 to 4464, thereby forming the additional curved split plates 4465 to 4468 that may be circumferentially arranged under the peripheral portion of the upper plate 442. Therefore, a middle deformation at a middle portion of the probe card 300 between the central portion and the peripheral portion may be effectively restricted by the additional curved split plates 4465 to 4468.

Figure 11C:
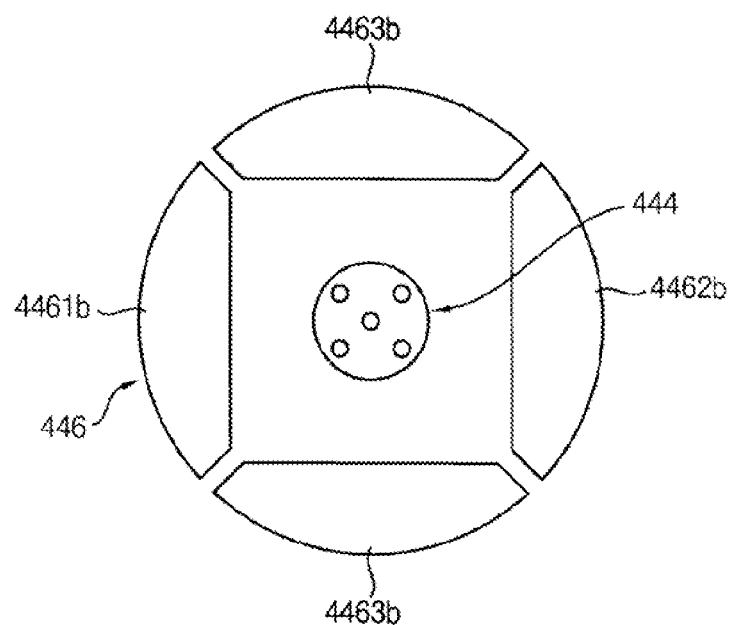
Figure 11D:
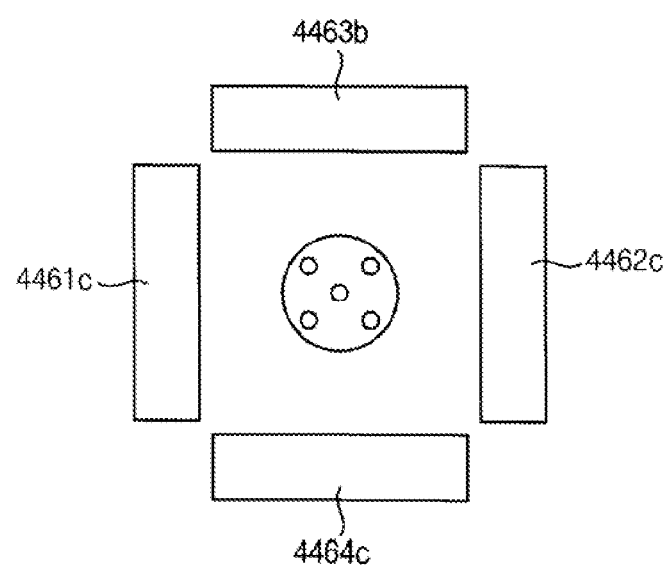

As shown in FIG. 11C, the inner curved arcs of the curved split plates 4461 to 4464 may be changed into lines, to thereby enlarge the curved split plates 4461b to 4464b. Further, as shown in FIG. 11D, the curved split plates 4461 to 4464 may be changed into rectangular split plates 4461c to 4464c.

The foregoing modifications are illustrative of the second lower plates 446 and are not to be construed as limiting thereof, and any other modifications may be allowable to the second lower plates 446 in view of the distribution of peripheral deformations of the probe card 300 and the assembly and separation facility of the split pieces.

In addition, the positions of the second elastic member 447 and the second guide 448 for securing the second lower plates 446 to the upper plate 442 may also be changed based on the modifications of the second lower plates 446. In this case, the positions of the peripheral penetration holes 442c and the second upper and lower receiving portions 447-1 and 447-2 may also be changed based on the position changes of the second elastic members 447 and the second guides 448.

The first and the second elastic members 445 and 447 may generate the restrictive forces within the elastic limit in proportion to the contact forces between the probe card 300 and the wafer W when the probe tips 332 and the test pads 5 of the semiconductor devices 1 make contact with each other. Thus, as a deformation of the probe card 300 increases, a greater restrictive force may be applied to the first and the second lower plates 444 and 446 to restrict the deformation of the probe card 300.

In a present exemplary embodiment, elastic forces may be applied to the probe card 300 in proportion to the deformation of the probe card 300 by the first and the second elastic members 445 and 447, so that the deformation of the probe card 300 may be restricted. The first elastic member 445 may include a plurality of elastic bodies that may be symmetrically positioned with respect to a central axis of the first lower plate 444, and the second elastic member 447 may include a pair of elastic bodies, one of which may be positioned at each end portion of each split plate.

An upper portion of the first elastic member 445 may be received in the first upper receiving portion 445-1 of the upper plate 442 and a lower portion of the first elastic member 445 may be received in the first lower receiving portion 445-2 of the first lower plate 444. In addition, an upper portion of the second elastic member 447 may be received in the second upper receiving portion 447-1 of the upper plate 442 and a lower portion of the second elastic member 447 may be received in the second lower receiving portion 445-2 of the second lower plate 446.

In a present exemplary embodiment, the first elastic member 445 may comprise four springs interposed between the upper plate 442 and the first lower plate 444 that are symmetrically positioned with respect to the central penetration hole 443a. Since the same tensile forces may be initially applied to the four springs, the upper plate 442 and the first lower plate 444 may be parallel with each other. That is, the upper plate 442 and the first lower plate 444 may have the same level. In addition, the second elastic member 447 may comprise a pair of springs interposed between the upper plate 442 and the second lower plates 446 with one at each end portion of each second lower plates 446. Since the same tensile forces may be initially applied to the pair of the springs, the upper plate 442 and the second lower plates 446 may be parallel with each other. That is, the upper plate 442 and all of the second lower plates 446 may have the same level.

The first and the second elastic members 445 and 447 may include other elastic elements such as elastomers as well as coil springs. In case of an elastomer and a coil spring, the central axis of the coil spring and the elastomer may be set parallel to the z-axis. In particular, the elastomer may have a hollow shaft shape. The restrictive forces that restrict the deformation of the probe card 300 may be controlled by varying the elastic modulus of the first and the second elastic members 445 and 447.

The first and the second guides 449 and 448 may guide the first and the second lower plates 444 and 446 to move up and down along the z-axis direction, respectively.

The first guide 449 may include a single guide column that may penetrate the central penetration hole 443a of the upper plate 442 and may be secured to the first combining portion 444a of the first lower plate 444. The second guide 448 may include guide columns that may penetrate the peripheral penetration holes 443b of the upper plate 442 and may be secured to the second combining portions 446a of the second lower plates 446.

In a present exemplary embodiment, a single guide column may be secured to the first lower plate 444 and a pair of the guide columns may be secured to both end portions of each of the second lower plates 446. The first guide 449 may have substantially the same structure as the second guide 448, thus for convenience the detailed descriptions of the guide columns may be presented based on the first guide 449. Alternatively, the first guide 449 may have a different structure from the second guide 448, as would be known to one of the ordinary skill in the art.

For example, referring back to FIG. 8, the first guide column 449 may include a body portion 449a, a head portion 449b and a joint portion 449c. The body portion 449a may have a rod shape and may be inserted into the central penetration hole 443a so that the body portion 449a may extend toward the first lower plate 444. The head portion 449b may be connected to an upper portion of the body portion 449a and may be received in the central recess 442b, which has a width greater than that of the central penetration hole 443a. That is, the head portion 449b may be supported on a bottom of the central recess 442b. The joint portion 449c may be connected to a lower portion of the body portion 449a and may include a male screw on a circumferential surface thereof. The joint portion 449c may be screwed into the first combining portion 444a, thus the guide column may be combined with the first lower plate 444 by a screw joint.

A test such as an EDS process may be performed in the above test apparatus 1000 as follows.

First, the first combining members 312, which may be circumferentially disposed along the peripheral portion of the circuit board 310 of the probe card 300, may be combined with the second combining members 436, which may be circumferentially disposed along the cylindrical base 430 of the tester 400, to combine the probe card 300 and the tester 400 with each other. Then, the support 220, to which the wafer W including the semiconductor devices 1 may be secured, may be moved upward in the z-axis direction, until the test pads 5 of the semiconductor devices 1 make contact with the probe tips 332 of the probe card 300.

Once the probe card 300 has a sufficient level and the probe tips 332 have made accurate contact with the test pads 5 of the semiconductor devices 1, the main body 410 of the tester 400 may transmit test signals to the probe card 300 through the test head 420. The test signals may be respectively applied to the test pads 5 via the probe tips 332, and the device signals from the semiconductor devices 1 may be transmitted to the test head 420 via the probe tips 332. Thus, electrical characteristics of all semiconductor devices 1 on the wafer W may be tested in the test chamber 200. Then, the device signals that include the test information may be transmitted to the main body 410 from the test head 420 to be analyzed according to a preset test criteria. The tester 400 may determine whether each semiconductor device 1 on the wafer W passes or fails based on the test results.

In particular, the level of the probe card 300 may be accurately controlled by the level controller 440 when the probe card 300 makes contact with the tester 400.

Figure 12:
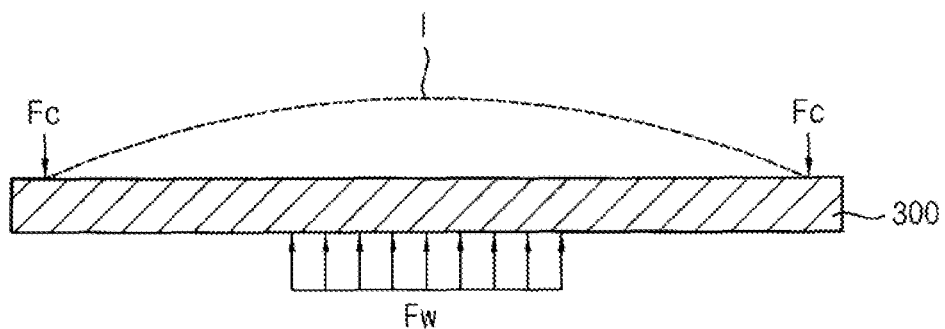
FIG. 12 is a free body diagram (FBD) that illustrates an external contact force and a deformation of the probe card when the probe tip and the test pad make contact with each other in the test apparatus shown in FIG. 3.

FIG. 12 is a free body diagram (FBD) that illustrates an external contact force and a deformation of the probe card when the probe tip and the test pad make contact with each other in the test apparatus shown in FIG. 3.

Referring to FIG. 12, since the probe column 330 to which the probe tips 332 have been installed may be positioned at the central portion of the circuit board 310, the external contact forces Fw may act on the central portion of the probe card 300. In addition, since the probe card 300 and the base 430 may be combined by the first and the second combining members 312 and 436 at peripheral portions thereof, a pair of the support forces Fc may be applied downwards in a −z direction at both end portion of the probe card 300.

Therefore, a maximal bending stress may be applied to the central portion of the probe card 300 and the probe card 300 may be deformed into a concave shape. That is, the probe card 300 may be deformed into a parabola I due to the external contact forces Fw.

When the probe card 300 is non-uniformly deformed along the parabola I, the first and the second elastic members 445 and 447 of the level controller 440 may generate first and second elastic forces Fs1 and Fs2 as the restrictive force to restrict the deformation of the probe card 300. That is, the first and the second elastic forces Fs1 and Fs2 may be applied to the probe card 300 as the restrictive force.

Figure 13:
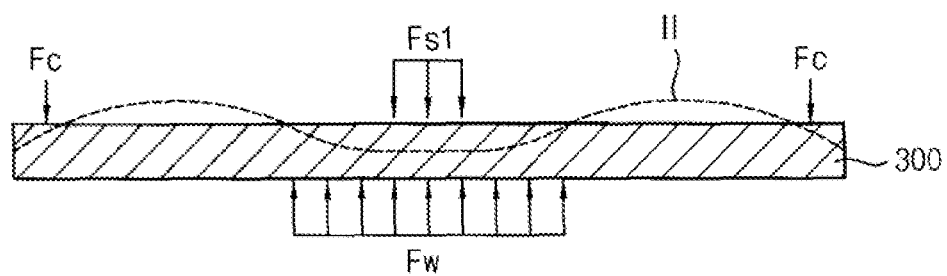
FIG. 13 is a free body diagram that illustrates an external contact force, a first restrictive force and a deformation of the probe card when the probe tip and the test pad make contact with each other and a first restrictive force is applied to a central portion of the probe card in the test apparatus shown in FIG. 3.

FIG. 13 is a free body diagram that illustrates an external contact force, a first restrictive force and a deformation of the probe card when the probe tip and the test pad make contact with each other and a first restrictive force is applied to a central portion of the probe card in the test apparatus shown in FIG. 3.

Referring to FIG. 13, since the deformation of the probe card 300 may be maximal at a central portion, the first elastic force Fs1, that is, the first restrictive force, may be applied to the central portion in proportion to the central deformation by the first lower plate 444 of the level controller 440.

Thus, the central deformation of the probe card 300 may be restricted and the level may be sufficient at the central portion of the probe card 300.

However, the first restrictive force may not be sufficient to counterbalance the whole contact force Fw, and the support force Fc may still deform the probe card 300 at the peripheral portion. Thus, the probe card 300 may be locally deformed between the central portion and the peripheral portion.

In particular, since an EDS process may be repeatedly performed over a wide temperature range, the probe card 300 may experience thermal deformations due to temperature variations as well as mechanical deformations due to the contact force Fw. Since the first elastic force Fs1 may be proportional to the central deformation, a total deformation that includes the mechanical deformation and the thermal deformation may be sufficiently restricted by the first elastic force Fs1 of the first restrictive force at the central portion of the probe card 300. However, mechanical deformations and thermal deformations may remain at the peripheral portion of the probe card 300. Thus, when the contact force Fw and the first restrictive force Fs1 is applied to the probe card 300, the peripheral portion of the probe card 300 may be deformed into a parabola and the central portion of the probe card 300 may be flat. That is the probe card 300 may be deformed into a wave shape II due to the external contact force Fw and the first restrictive force Fs1.

Figure 14:
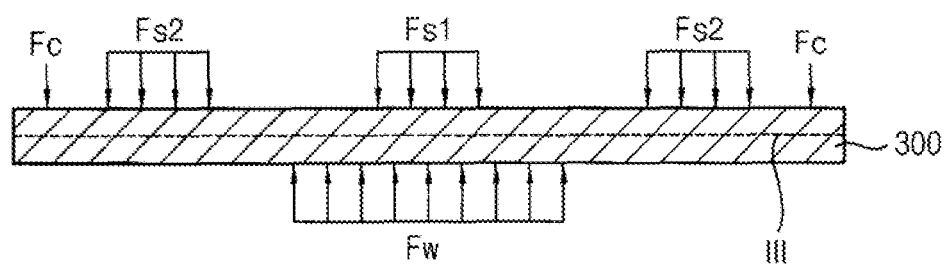
FIG. 14 is a free body diagram that illustrates an external contact force, first and second restrictive forces and a deformation of the probe card when the probe tip and the test pad make contact with each other and first and second restrictive forces are applied to a central portion and a peripheral proton of the probe card, respectively, in the test apparatus shown in FIG. 3.

FIG. 14 is a free body diagram illustrating an external contact force, first and second restrictive forces and a deformation of the probe card when the probe tip and the test pad makes contact with each other and first and second restrictive forces are applied to a central portion and a peripheral proton of the probe card, respectively, in the test apparatus shown in FIG. 3.

Referring to FIG. 14, the second elastic force Fs2, that is, the second restrictive force, may be applied to the peripheral deformation of the peripheral portion by the second lower plate 446 of the level controller 440. Thus, the peripheral deformation of the probe card 300 may be restricted and the level may be sufficient at the peripheral portion of the probe card 300.

Even though the peripheral portion of the probe card 300 may have a different local temperature and thus may have a different local thermal deformation, the second restrictive force may be locally applied to the peripheral portion of the probe card 300. The second lower plates 446 may include split plates that may be respectively arranged and independently varied, and thus each second lower plate 446 may generate a respective elastic force in proportion to the local deformation of the peripheral portion of the probe card 300. That is, the second restrictive forces may be individually applied to the peripheral portion of the probe card 300 based on the amount of the respective peripheral deformation, thereby accurately controlling the peripheral deformation.

Therefore, the thermal deformation and the mechanical deformation of the probe card 300 may be sufficiently restricted by the first and the second elastic forces Fs1 and Fs2 that may be respectively generated by the level controller 440, and the level of the probe card 300 may be unchanged or maintained in spite of the bending and thermal stresses on the probe card 300 while testing the semiconductor devices. That is, the first and the second restrictive forces Fs1 and Fs2 may allow the probe card 300 to be sufficiently level, as indicated by level line III shown in FIG. 14.

When the contact force Fw exceeds the allowable elastic limit of the first and the second elastic members 445 and 447, the probe tips 332 of the probe card 300 may break or be damaged by the excessive contact force. In this case, the first and the second lower plates 444 and 446 may move upwards along the first and second guides 449 and 448 in the z-axis direction, to prevent damage to the probe tips 332 and deterioration of the level of the probe card 300.

According to exemplary embodiments of the test apparatus, both peripheral and central deformations of the probe card may be sufficiently restricted while performing a test process such as an EDS process in the test apparatus. The peripheral deformations and the central deformations may be individually controlled by the respective plates of the level controller, which may accurately control the level of the probe card.

In particular, the second lower plates that make contact with the peripheral portion of the probe card may be composed a plurality of split pieces, and each of the split pieces may be independently disposed from each other. Therefore, although the peripheral deformations may differ locally from point to point in the peripheral portion of the probe cared, each split piece may generate a restrictive force in proportion to the local deformation of the peripheral portion. In addition, since the split pieces may be individually replaced or repaired, the maintenance cost of the second lower plates may be reduced.

Accordingly, the level of a probe card may be accurately controlled so that the probe tips and test pads of the semiconductor devices may accurately contact each other, thereby improving the reliability of an electrical test process such as an EDS process.

The present exemplary embodiments of a tester and a test apparatus may be applied to various testing apparatuses for various electronic devices and systems which need an accurate level in the testing process and the probe card system.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present invention. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A tester for testing electrical characteristics of semiconductor devices, comprising;
    a main body that generates test signals that test the electrical characteristics of a semiconductor device and analyze device signals generated by the semiconductor device in response to the test signals;
    a head connected to the main body and that processes the test signals and the device signals;
    a base connected to the head and to which a probe card is secured, wherein the probe card selectively makes contact with the semiconductor device; and
    a level controller inside of the base and that independently restricts a peripheral deformation of the probe card and a central deformation of the probe card, to control a level of the probe card,
    wherein the level controller includes:
    an upper plate connected to the inside of the base and spaced above the probe card;
    a first lower under the upper plate that is in contact with a central portion of the probe card;
    a plurality of second lower plates under the upper plate that are in contact with a peripheral portion of the probe card, the plurality of the second lower plates being independently positioned and separated from the first lower plate;
    a first elastic member interposed between the upper plate and the first lower plate, the first elastic member applying a first restrictive force to the central portion of the probe card in proportion to the central deformation, to restrict the central deformation of the probe card; and
    a plurality of second elastic members interposed between the upper plate and the plurality of the second lower plates, the second elastic members applying a second restrictive force to the peripheral portion of the probe card in proportion to the peripheral deformation, to restrict the peripheral deformation of the probe card,
    wherein the first lower plate includes a single disk under a central portion of the upper plate and the plurality of second lower plates includes a plurality of split pieces under a peripheral portion of the upper plate that are spaced apart from and enclose the first lower plate.

2. The tester of claim 1, wherein the base includes a hollow cylinder and the upper plate includes a single disk that has a plurality of stepped portions at an edge portion thereof, wherein the stepped portions of the upper plate are circumferentially combined with the hollow cylinder of the base.

3. The tester of claim 1, wherein the split pieces are independently positioned on the probe card, wherein each split piece independently applies the second restrictive force to the peripheral portion of the probe card.

4. The tester of claim 3, wherein the split pieces include curved split pieces that are separated from an annulus that encloses the first lower plate.

5. The tester of claim 4, wherein the plurality of the second lower plates further includes an additional plurality of curved split plates that are positioned between the curved split pieces and the first lower plate.

6. The tester of claim 1, wherein the first elastic member includes a plurality of elastic bodies that are symmetrically positioned with respect to a central axis of the first lower plate, and the plurality of second elastic members includes a plurality of elastic bodies, wherein an elastic body is positioned at each end portion of each split piece.

7. The tester of claim 6, wherein the elastic body includes one of a spring and an elastomer.

8. The tester of claim 1, wherein the level controller further includes:
    a first guide connected to a central portion of the first lower plate and that penetrates the central portion of the upper plate, the first guide guiding the first lower plate to move up and down; and
    a plurality of second guides connected to both end portions of each split piece that penetrate the peripheral portion of the upper plate, the plurality of second guides guiding each of the split pieces to move up and down.

9. A test apparatus for testing semiconductor devices, comprising:
    a test chamber holds a wafer that includes a plurality of semiconductor devices;
    a probe card disposed over the test chamber and that makes contact with the semiconductor devices being tested; and a tester connected to the probe card that transmits test signals for testing the semiconductor devices to the probe card and to receives device signals generated by the semiconductor devices in response to the test signals, to test electrical characteristics of the semiconductor devices, wherein the tester includes:

a main body that generates the test signals and analyze the device signals;

a head connected to the main body and that processes the test signals and the device signals;

a base connected to the head and to which the probe card is secured; and a level controller inside of the base and that independently restricts a peripheral deformation of the probe card and a central deformation of the probe card, to control a level of the probe card, wherein the level controller includes:

an upper plate connected to the inside of the base and spaced above the probe card;

a first lower under the upper plate that is in contact with a central portion of the probe card;

a plurality of second lower plates under the upper plate that are in contact with a peripheral portion of the probe card, the plurality of the second lower plates being independently positioned and separated from the first lower plate;

a first elastic member interposed between the upper plate and the first lower plate, the first elastic member applying a first restrictive force to the central portion of the probe card in proportion to the central deformation, to restrict the central deformation of the probe card; and a plurality of second elastic members interposed between the upper plate and the plurality of the second lower plates, the second elastic members applying a second restrictive force to the peripheral portion of the probe card in proportion to the peripheral deformation, to restrict the peripheral deformation of the probe card, wherein the first lower plate includes a single disk under a central portion of the upper plate and the plurality of second lower plates includes a plurality of split pieces under a peripheral portion of the upper plate that are spaced apart from and enclose the first lower plate.

10. The test apparatus of claim 9, wherein the level controller further includes:

a first guide connected to a central portion of the first lower plate and that penetrates the central portion of the upper plate, the first guide guiding the first lower plate to move up and down; and a plurality of second guides connected to both end portions of each second lower plate and penetrating the peripheral portion of the upper plate, the plurality of second guides guiding each of the second lower plates to move up and down.

11. The test apparatus of claim 10, wherein the test chamber includes a support to which the wafer is secured and a position controller that moves the support so that the semiconductor devices make contact with the probe card.

12. A test apparatus for testing electrical characteristics of semiconductor devices, comprising:

a probe card disposed in a test chamber and that makes contact with a plurality of semiconductor devices being tested; and a level controller inside of a base of a tester that includes:

an upper plate connected to the inside of the base and spaced above the probe card;

a first lower plate under the upper plate tha is in contact with a central portion of the probe card;

a plurality of second lower plates under the upper plate that are in contact with a peripheral portion of the probe card;

a first elastic member interposed between the upper plate and the first lower plate, the first elastic member applying a first restrictive force to the central portion of the probe card in proportion to the central deformation, to restrict a central deformation of the probe card; and a plurality of second elastic members interposed between the upper plate and the plurality of second lower plates, the second elastic members applying a second restrictive force to the peripheral portion of the probe card in proportion to a peripheral deformation, to restrict the peripheral deformation of the probe card, wherein the first lower plate includes a single disk under a central portion of the upper plate and the plurality of second lower plates includes a plurality of split pieces under a peripheral portion of the upper plate that are spaced apart from and enclose the first lower plate.

13. The test apparatus of claim 12, wherein the tester includes:

a main body that generates test signals and analyze device signals; and a head connected to the main body and transmits test signals for testing the semiconductor devices to the probe card and to receives device signals generated by the semiconductor devices in response to the test signals, to test electrical characteristics of the semiconductor devices, wherein the base is connected to the head and secures the probe card.

14. The test apparatus of claim 12, wherein the probe card includes a plurality of first combining members circumferentially positioned on a peripheral portion of an upper surface thereof that combine with second combining members positioned at a bottom of the base of the tester, and a plurality of probe tips positioned on a lower surface thereof that make contact with test pads of the semiconductor devices being tested.

15. The test apparatus of claim 12, wherein the split pieces are independently positioned on the probe card and include curved split plates that are separated from an annulus that encloses the first lower plate, wherein each split piece independently applies the second restrictive force to the peripheral portion of the probe card, wherein the first elastic member includes a plurality of elastic bodies that are symmetrically positioned with respect to a central axis of the first lower plate, and the plurality of second elastic members includes a plurality of elastic bodies, wherein an elastic body is positioned at each end portion of each split piece.

16. The test apparatus of claim 15, wherein the level controller further includes:

a first guide connected to a central portion of the first lower plate and that penetrates the central portion of the upper plate, the first guide guiding the first lower plate to move up and down; and a plurality of second guides connected to both end portions of each split piece that penetrate the peripheral portion of the upper plate, the plurality of second guides guiding each of the split pieces to move up and down.

\* \* \* \* \*